US010938358B2

(12) United States Patent
Watkins

(10) Patent No.: US 10,938,358 B2
(45) Date of Patent: Mar. 2, 2021

(54) DIGITAL POWER AMPLIFIER

(71) Applicant: Kabushiki Kaisha Toshiba, Minato-ku (JP)

(72) Inventor: Gavin Tomas Watkins, Bristol (GB)

(73) Assignee: Kabushiki Kaisha Toshiba, Minato-ku (JP)

( * ) Notice: Subject to any disclaimer, the term of this patent is extended or adjusted under 35 U.S.C. 154(b) by 80 days.

(21) Appl. No.: 16/176,684

(22) Filed: Oct. 31, 2018

(65) Prior Publication Data

US 2020/0136572 A1 Apr. 30, 2020

(51) Int. Cl.
| | | |
|---|---|---|
| *H03F 3/68* | (2006.01) | |
| *H03F 3/21* | (2006.01) | |
| *H03F 3/193* | (2006.01) | |
| *H03F 1/02* | (2006.01) | |
| *H04L 27/26* | (2006.01) | |

(52) U.S. Cl.
CPC ........... *H03F 3/211* (2013.01); *H03F 1/0205* (2013.01); *H03F 3/193* (2013.01); *H04L 27/2614* (2013.01); *H03F 2200/255* (2013.01); *H03F 2200/301* (2013.01); *H03F 2200/336* (2013.01); *H03F 2200/423* (2013.01); *H03F 2203/21103* (2013.01); *H03F 2203/21106* (2013.01); *H03F 2203/21139* (2013.01)

(58) Field of Classification Search
CPC ........ H03F 3/211; H03F 1/3241; H03F 3/193; H03F 2200/255; H03F 2200/336; H03F 2203/21106; H03F 2200/301; H03F 2200/423; H03F 2203/21103; H03F 2203/21139; H03F 3/602; H03F 3/604; H03F 1/0288; H03F 1/07; H03F 2201/3215; H03F 2203/21142; H03F 2200/451; H03F 2200/204; H03F 1/0205; H01P 5/16; H04B 1/0475; H04B 2001/0408; H04W 88/08; H04W 88/02; H04L 27/2614
USPC .............................................. 330/124 R, 295
See application file for complete search history.

(56) References Cited

U.S. PATENT DOCUMENTS 5,066,925 A * 11/1991 Freitag .................... H03F 3/602
                                                           330/269
5,939,939 A *  8/1999 Gaynor ................... H03F 3/602
                                                           330/124 R (Continued)

FOREIGN PATENT DOCUMENTS

EP    3 035 526 A1   6/2016
JP    2012-114711 A  6/2012

(Continued)

OTHER PUBLICATIONS

Shirvani, A., et al., "A CMOS RF Power Amplifier with Parallel Amplification for Efficient Power Control", IEEE Journal of Solid-State Circuits, vol. 37 No. 6, Jun. 2002, pp. 684-693.

(Continued)

*Primary Examiner* — Khanh V Nguyen
(74) *Attorney, Agent, or Firm* — Oblon, McClelland, Maier & Neustadt, L.L.P.

(57) ABSTRACT

A digital power amplifier comprising two or more individually activatable amplifiers. The outputs of the amplifiers are connected causing an activated amplifier of the two or more amplifiers to load modulate another activated amplifier of the two or more amplifiers.

12 Claims, 10 Drawing Sheets

(56) References Cited

U.S. PATENT DOCUMENTS

| | | | |
|---|---|---|---|
| 7,046,088 B2* | 5/2006 | Ziegler | H03F 1/56 330/207 A |
| 8,115,554 B2* | 2/2012 | Ng | H03F 1/086 330/124 R |
| 8,346,189 B2* | 1/2013 | Dupuy | H03F 1/0222 330/124 R |
| 8,648,665 B2* | 2/2014 | Hauer | H01S 3/09702 333/17.3 |
| 10,063,190 B2* | 8/2018 | Pham | H03F 3/193 |
| 2010/0176880 A2* | 7/2010 | Dupuy | H03F 3/245 330/124 R |
| 2010/0315162 A1* | 12/2010 | Gajadharsing | H03F 1/08 330/124 R |
| 2012/0176194 A1* | 7/2012 | Kim | H03F 1/0288 330/124 R |
| 2014/0368274 A1 | 12/2014 | Kimura | |
| 2015/0048899 A1 | 2/2015 | Van Der Heijden | |
| 2015/0137885 A1 | 5/2015 | Kingsley | |
| 2015/0255219 A1 | 9/2015 | Schenk | |
| 2016/0204970 A1 | 7/2016 | Hori | |
| 2016/0211815 A1* | 7/2016 | Imai | H03F 3/193 |
| 2016/0226450 A1 | 8/2016 | Ma et al. | |
| 2017/0237407 A1 | 8/2017 | Babaie et al. | |
| 2017/0324381 A1 | 11/2017 | Qian et al. | |
| 2018/0026583 A1* | 1/2018 | Yanduru | H03F 1/301 330/289 |

FOREIGN PATENT DOCUMENTS

| | | |
|---|---|---|
| JP | 2012-235382 A | 11/2012 |
| TW | 201637356 A | 10/2016 |
| WO | WO 2018/132006 A1 | 7/2018 |

OTHER PUBLICATIONS

Motoi, K., et al., "Digital Doherty Transmitter with Envelope $\Delta\Sigma$ Modulated Class-D GaN Power Amplifier for 800 MHz Band", IEEE MTT-S International Microwave Symposium (IMS2014), 2014, pp. 1-4.

Li, T., et al., "A Wideband Efficiency-Enhanced Class-G Digital Power Amplifier for IoT Applications", IEEE Microwave and Wireless Components Letters, vol. 28 No. 8, Aug. 2018, pp. 714-716.

Hashemi, M., et al., "An Intrinsically Linear Wideband Polar Digital Power Amplifier", IEEE Journal of Solid-State Circuits, vol. 52 No. 12, Dec. 2017, pp. 3312-3328.

Yoo, S.-M., et al., "A Power-Combined Switch-Capacitor Power Amplifier in 90nm CMOS", 2011 IEEE Radio Frequency Integrated Circuits Symposium, 2011, pp. 1-4.

\* cited by examiner

DIGITAL POWER AMPLIFIER

FIELD

Embodiments described herein relate generally to digital power amplifiers and in particular to digital power amplifiers using load modulation.

BACKGROUND

Contemporary communications, broadcast and wireless standards like LTE, DVB/ISDB and 802.11ax, are all based on orthogonal frequency division multiplexing (OFDM) modulation. Although OFDM is very spectrally efficient, it does so at the expense of a high peak-to-average power ratio (PAPR), which for the RF power amplifier (PA) in a transmitter equates to low average efficiency. It is likely that future, fifth generation (5G) standards will have an even greater PAPR, leading to even lower average operating efficiency.

Conventional single device RF PAs (i.e. class A, B, C, E, F and J) are capable of high efficiency only in their saturation region, i.e. peak output power (P). As $P_{OUT}$ is reduced, efficiency degrades. In know device the input power may be reduced to the amplifiers to allow accommodating the peaks without clipping them and causing distortion. This is referred to as "backing-off". Contemporary communications, broadcast and wireless connectivity standards require that on average, a PA operates at significant back-off to accommodate the large signal peaks. These peaks can often be 10 dB larger than the average $P_{OUT}$.

Arrangements of the present invention will be understood and appreciated more fully from the following detailed description, made by way of example only and taken in conjunction with drawings in which.

DETAILED DESCRIPTION

Figure 1:
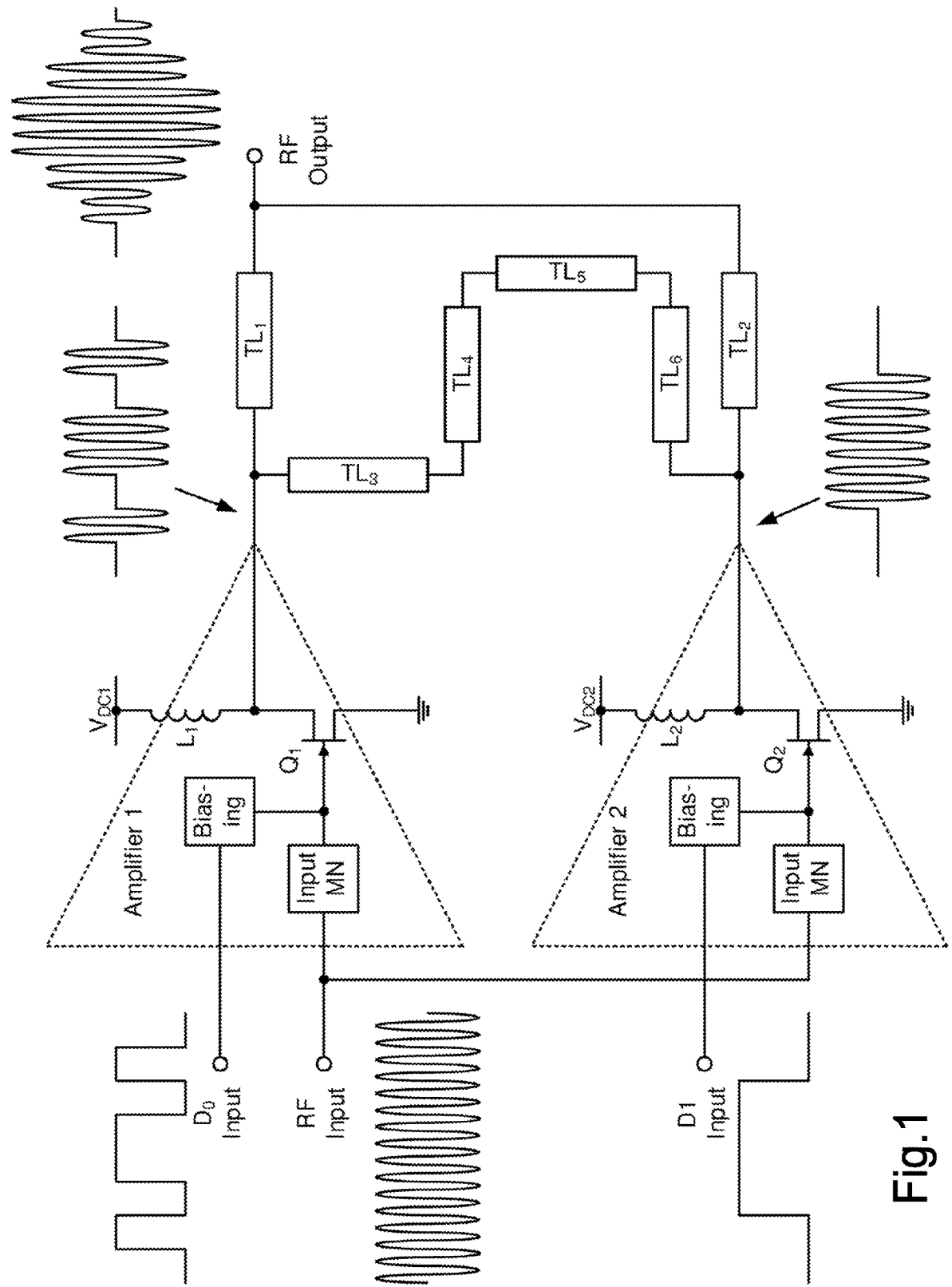
FIG. 1 shows a digital PA according of an embodiment.

According to an embodiment there is provided a digital power amplifier comprising two or more individually activatable amplifiers. The outputs of the amplifiers are connected to cause an activated amplifier of the two or more amplifiers to load modulate another activated amplifier of the two or more amplifiers.

The connection that connects the amplifier outputs may in particular be designed so that when more than one amplifier is operating, the operating amplifiers experience load-pull to increase their output power.

The amplifiers can have the same or different supply voltages.

Each amplifier has its own transistor device. The same model of devices can be used for the amplifiers. Alternatively different models may be used.

The outputs of two of the two or more amplifiers are connected by two signal paths.

The outputs of each pairing of two amplifiers of the two or more amplifiers may be connected with two signal paths.

The outputs of two or more amplifiers may be connected by a transmission line network.

The transmission line network can be based on a rat-race combiner. The impedances of the transmission lines can be altered from those of a standard ring combiner to enable said load modulation.

The impedances of transmission lines in the transmission line network may be selected so that the impedance presented to a first activated amplifier by the combination of the transmission line network and any other activated amplifiers sets the output power of the first activated amplifier so that the first activated amplifier operates in saturation.

The transmission line networks can include a phase inverter.

The two or more amplifiers may operate in current saturation at different saturation powers.

The digital power amplifier may further comprise a digital pre-distorter configured to predistort the input signal based on the properties of the combination of the two or more amplifiers and the connection of the amplifier outputs. Signal distortion introduced by the combination of the two or more amplifiers and the connection of the amplifier outputs reduces or removes the pre-distortion introduced by the pre-distorter.

The digital power amplifier may be configured to receive digital signals for individually activating and deactivating the two or more amplifiers, said signals individually applied as gate bias to transistors of the amplifiers.

The digital power amplifier may further comprise a signal splitter configured to split the input signal, wherein individual outputs of the splitter are individually connected to inputs of the amplifiers.

The splitter may split the signal into unequal output signals to operate the amplifiers in saturation.

The two or more amplifiers may be discrete devices. Discrete devices can handle larger output power levels, say around 100 W or more, than CMOS implementations (which are limited to below 100 W).

In an embodiment the two or more amplifiers and their connections are configured to provide output power levels in saturation optimised for a predetermined signal modulation scheme.

According to another embodiment there is provided a device comprising the above described digital power amplifier. The device may be a mobile phone basestation or a DVB transmitter.

In the DPA of embodiments the amplitude of the output RF modulated signal are controlled by digital means. The DPA itself forms the digital-to-analogue converter (DAC) of the transmitter and may also be referred to as an RFDAC.

The present embodiments are capable of achieving three separate $P_{OUT}$ levels with around 1 W peak transmit power. Combined with an off-state makes four separate $P_{OUT}$ levels are generated, producing a 2-bit DPA.

In embodiments comprising two amplifiers the output network enables the two amplifiers to load-pull each other to achieve the required output powers ($P_{OUT}$) at their respective states, thereby providing full 2-bit operation.

The transmission line network, in particular the connection of the amplifier outputs via two paths that comprise transmission lines, allows the number of states to be increased.

FIG. 1 shows an amplification system according to an embodiment. Two switching amplifiers are used, Amplifier 1 and Amplifier 2. The class in which the amplifiers operate is not important and any amplifier class may be implemented. Similarly, the number of amplifiers could be increased from the two in this arrangement to three or more.

An RF input is applied to the inputs of both amplifiers. Amplifier 1 consists of an active device Q1. In this example the active device is a Field Effect Transistor (FET) device; however, a bipolar transistor or other form of active device may be used instead. The active device Q1 has a gate that is driven by the RF signal through an input matching network (Input MN) and a biasing network. The input matching network is for impedance matching of the input signal.

Figure 12:
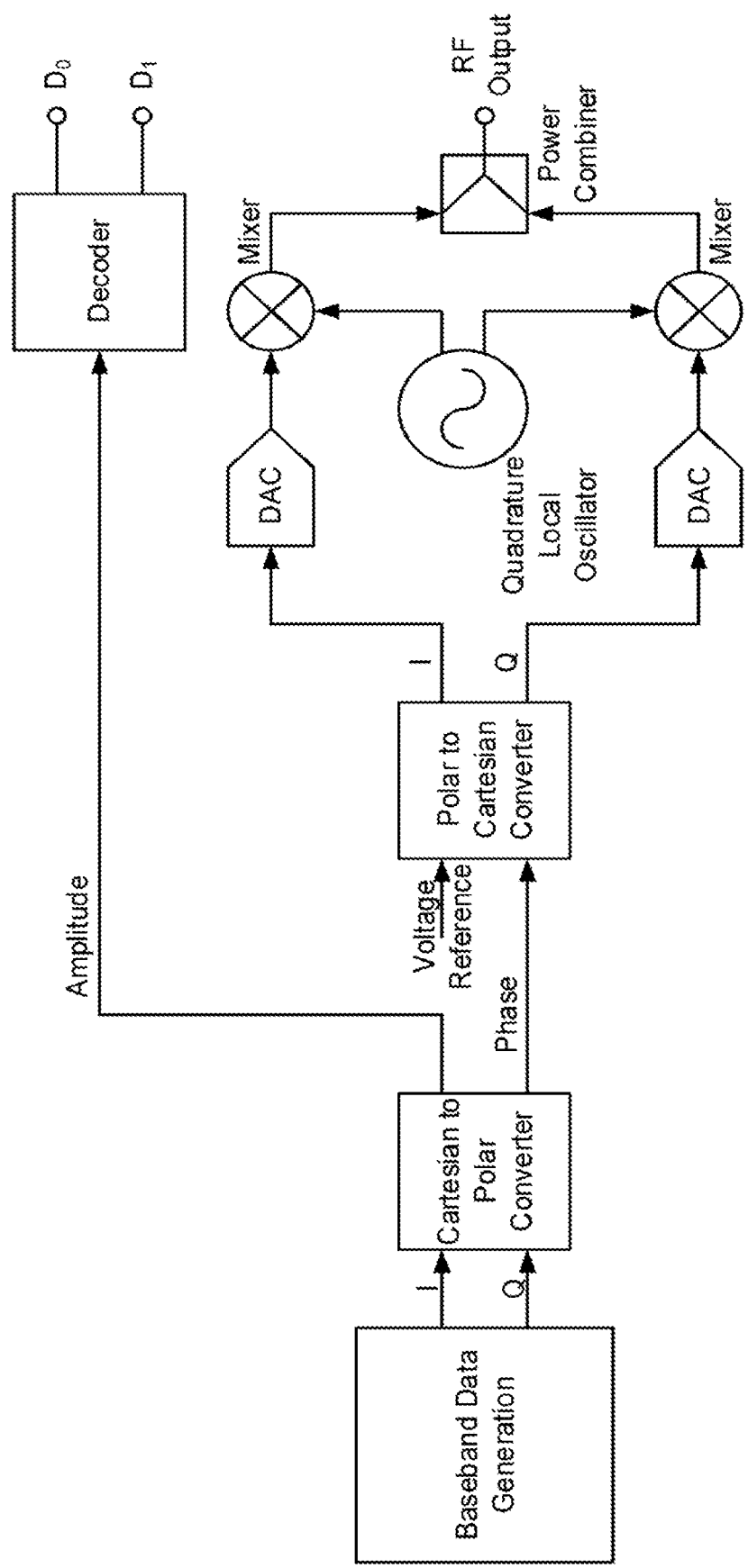
FIG. 12 shows an example of a network for generating the digital input signals for use in embodiments.

The biasing networks are connected to respective input nodes through which they receive input respective input signals $D_0$ and $D_1$. $D_0$ and $D_1$ are derived from the input data as shown in FIG. 12. Baseband data in I and Q cartesian format is converted to polar (amplitude and phase). The amplitude information is decoded to provide the signals $D_0$ and $D_1$. The phase only signal is converted back to I and Q with a fixed amplitude to be converter to analogue signals with Digital-to-Analogue Converters (DAC). These are then upconverted to RF by mixers, a quadrature local oscillator and power combiner.

The input signals $D_0$ and $D_1$ are switching signals that turn Amplifiers 1 and 2 on respectively when the signal is high and that turn Amplifiers 1 and 2 off respectively when the signal is low. The biasing networks are configured to convert the respective input digital signals ($D_0$ and $D_1$) into a signal of appropriate voltage for switching the active device on and off.

A first DC signal $V_{DC1}$ is supplied to a first inductor $L_1$, which in turn is connected to the drain of the active device $Q_1$. The first inductor $L_1$ is a high value inductor, or RF choke, which has high impedance at the RF operating frequency. The source of the active device is connected to ground.

In the present case, an N-channel FET is used. Accordingly, when a low voltage is applied to the gate, the conductivity of the FET drops thereby increasing the voltage at the drain. Conversely, when a high voltage is applied to the gate, the conductivity of the FET increases, lowering the drain voltage towards ground. The active device therefore amplifies the input signal by controlling the proportion of the supply voltage that is output at the drain.

Amplifier 2 is arranged in an identical manner, with a respective input signal $D_1$, biasing network, input matching network, gate $Q_2$ and first inductor $L_2$. Having said this, the two amplifiers are configured to have different peak output powers, as shall be discussed below. To provide improved efficiency across a wide range of input powers, Amplifier 1 and Amplifier 2 are tuned for different power ratings.

Figure 3:
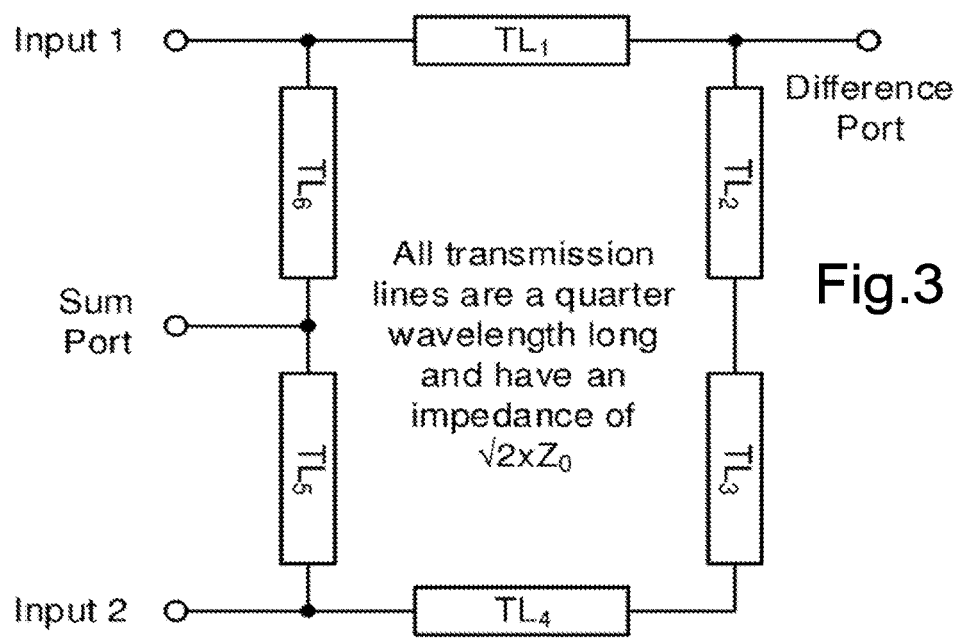
FIG. 3 shows a known rat-race combiner.

In the embodiment the six transmission line sections labelled in FIG. 1 as $TL_1$ to $TL_6$ form a rat-race combiner. Classic rat-race combiners consist of six transmission line sections, each a quarter wavelength in length and with a characteristic impedance of 70.7Ω if the system impedance is 50Ω. In contrast to standard rat-race combiners the actual dimensions of the six transmission lines $TL_1$ to $TL_6$ shown in FIG. 1 are not the same, but are optimised in length and impedance to achieve the required terminating impedances. They create an asymmetric power combiner where one amplifier will drive a lower impedance than the other. This is because the one amplifier must produce a greater $P_{OUT}$ than the other, as $P_{OUT}$ is inversely proportional to impedance. Standard rat-race combiners (as, for example, shown in FIG. 3) also include a fourth "difference" port. This fourth port is usually terminated with 50Ω. This is not used in the embodiments as it would dissipate power and therefore reduce system efficiency.

Figure 2:
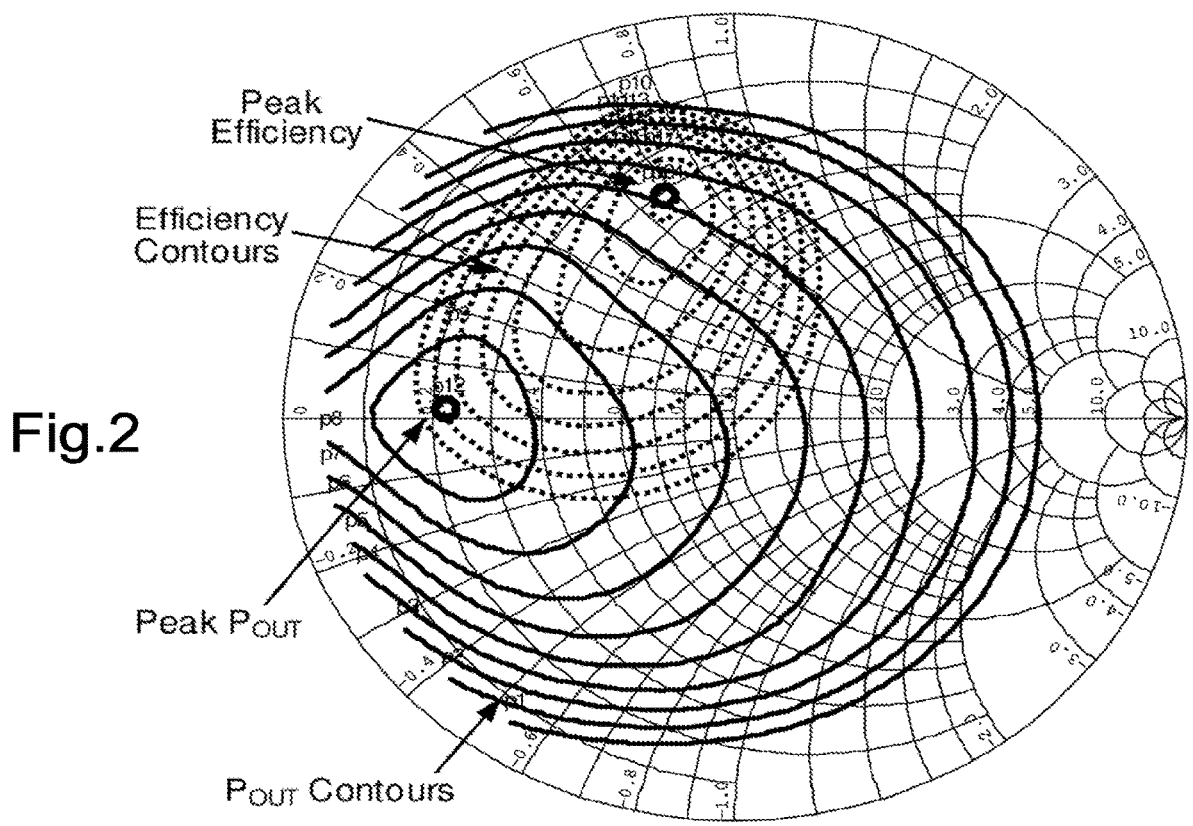
FIG. 2 shows load-pull characteristics of an ATF50189 GaAs FET transistor at 1.4 GHz.

Optimum operating impedances for the transmission lines $TL_1$ to $TL_6$ are determined from the load pull data to achieve the maximum efficiency at the required $P_{OUT}$. Example load-pull data is shown in FIG. 2 for an ATF50189 transistor at 1.4 GHz. Because the two amplifiers are designed to operate at different power levels, the impedances presented to them by the transmission line network will be different.

During the design process, simple optimisation algorithms are used to determine the dimensions of all the transmission line sections used in the output network, based on the required $P_{OUT}$ for the three "on" states (first state: Amplifier 1 ON, Amplifier 2 OFF; second state: Amplifier 1 OFF, Amplifier 2 ON; third state: Amplifier 1 ON, Amplifier 2 ON) and an efficiency target. A number of different combinations exist which met the requirements, representing different output network structures.

Figure 4:
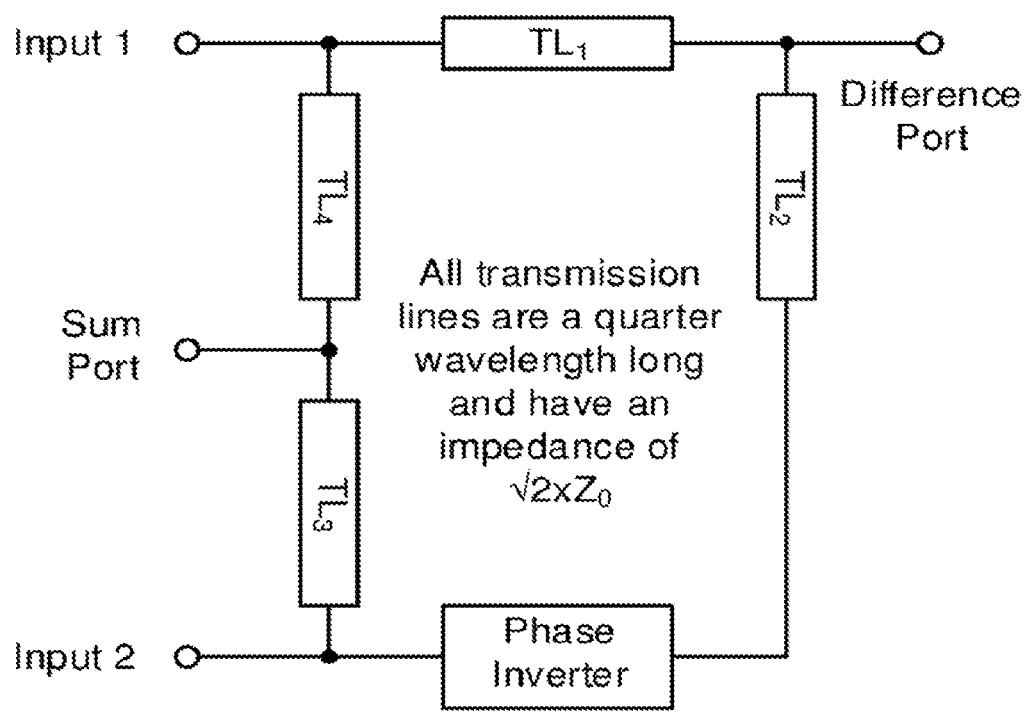
FIG. 4 shows a wideband rat-race or Ring combiner/divider with a phase inverter.

Standard rat-race combiners have moderate operating bandwidths. In an embodiment the operating bandwidth is increased by replacing two of the transmission line length (with a combined length of λ/2, equivalent to 180°) which a phase inverter, as shown in FIG. 4. The phase inverter could be a transformer. One or more phase inverters could also be incorporated, for example to replace $TL_3$ and $TL_4$ and/or $TL_5$ and $TL_6$.

The embodiment of FIG. 1 is structurally distinguished from known digital power amplifiers in that it the individual amplifier outputs are connected together so that the amplifiers can load modulate each other. As is shown in FIG. 1 the connection of the amplifier outputs uses two paths. It has been shown in simulations that this structure is capable to present impedances to the individual amplifiers that enable the amplifiers to operate in saturation at the desired power rating. This said, it is envisaged that alternative networks could instead be utilised to similar effect.

Figure 5:
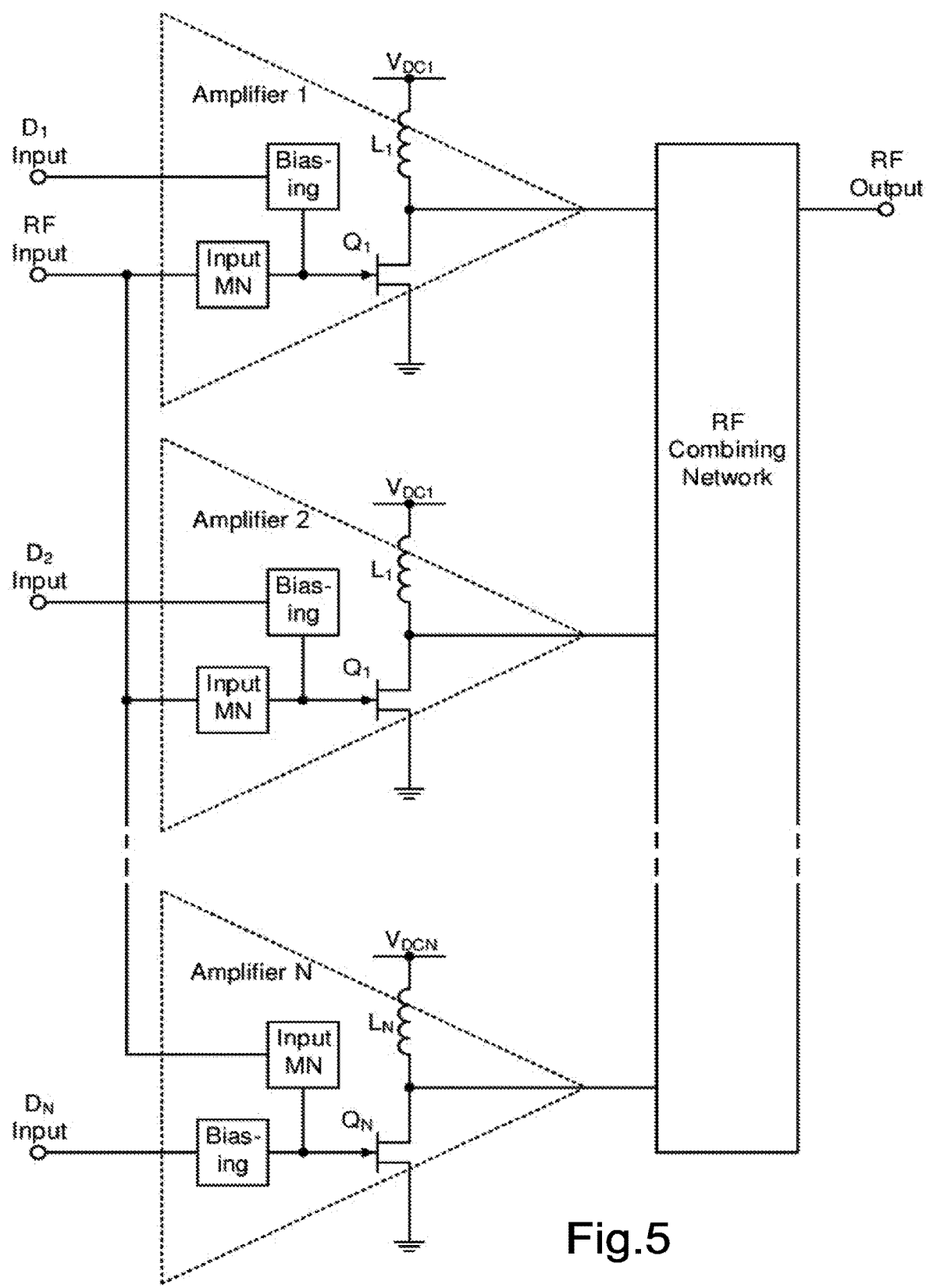
FIG. 5 shows a higher order DPA with more than two amplifiers that are output connected in a load modulating manner.
Figure 6:
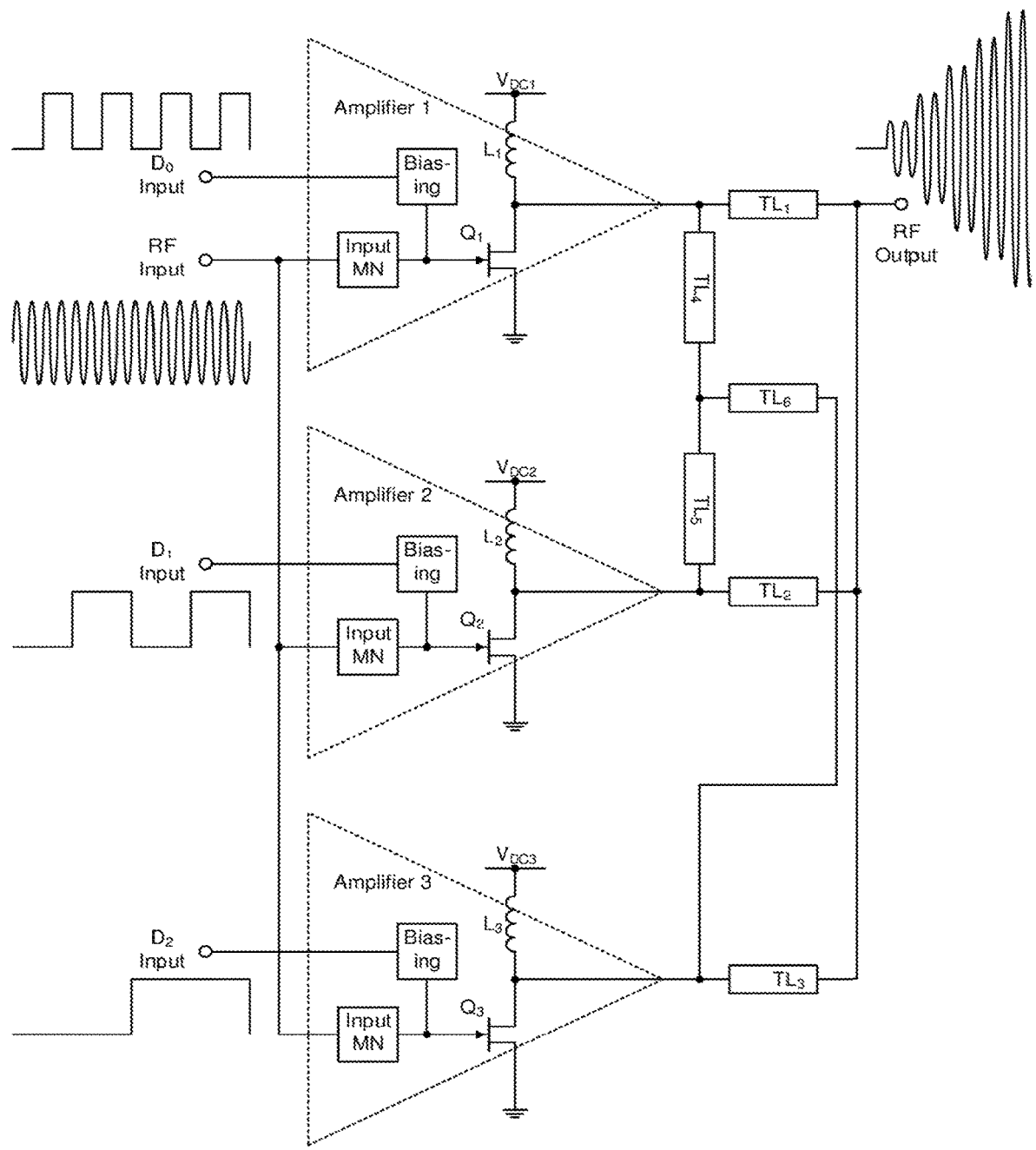
FIG. 6 shows a 3-Bit DPA based on two transmission line loops.

Embodiments are not limited to the use of only two amplifiers and in other embodiments more than two amplifiers may be connected to each other in a manner that allows the amplifiers involved to load modulate each other. An example of this is shown in FIG. 5. An example output combining network based on three transmission line loops (rat-race combiners) is shown in FIG. 6, where one loop is formed of $TL_1$, $TL_2$, $TL_5$ and $TL_6$, a second of $TL_1$, $TL_4$, $TL_3$ and $TL_6$ and a third of $TL_2$, $TL_3$, $TL_5$ and $TL_6$. It should be noted, that compared to FIG. 1, some of the transmission lines have been combined in FIG. 6 to enhance the clarity of the illustration.

Figure 7:
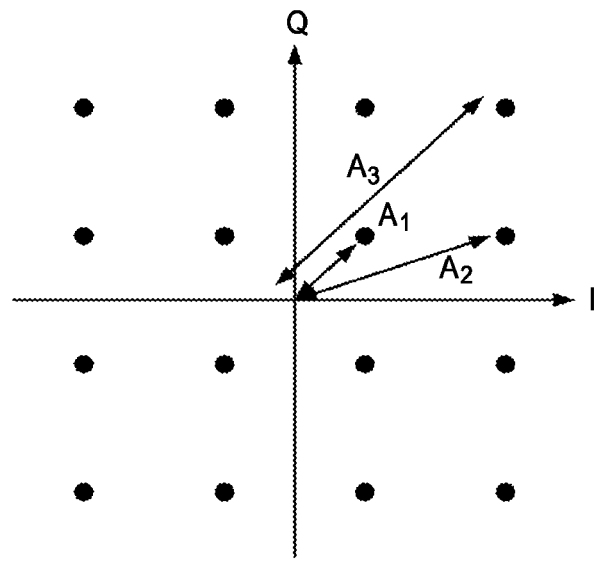
FIG. 7 shows a 16-QAM constellation diagram with three unique power amplitudes: A1, A2 and A3.
Figure 8:
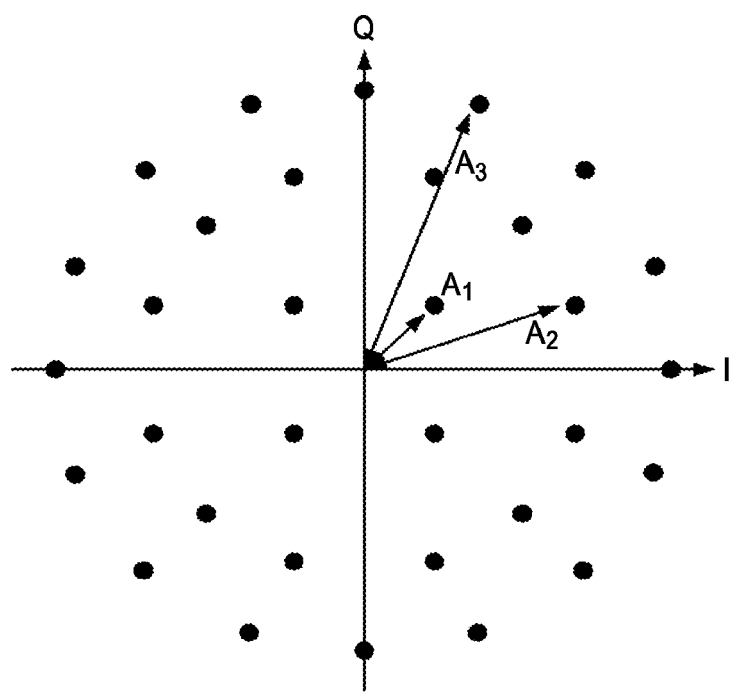
FIG. 8 shows a 32-APSK constellation diagram with three unique power amplitudes: A1, A2 and A3.

The impedances presented to the transistors of the amplifiers are tuned for a set of particular $P_{OUT}$s. They could for example follow the 6 dB steps size of a conventional DAC or be mapped onto a different set of amplitudes, for example the 16-QAM or 32-APSK constellation diagrams shown in FIGS. 7 and 8 respectively.

So far, the transmission line network has been used exclusively to determine the $P_{OUT}$ steps. In an embodiment this is expanded by selecting different physically sized devices, or different supply voltages (VDC) for each amplifier.

As far as is known, the embodiments present the only DPAs that exploits load modulation. Other, know DPAs do not use load modulation and do not scale to high powers. Embodiments moreover differ from known analogue load modulating amplifiers in that the amplifiers of the DPAs of the embodiment experience load modulation whenever more than one amplifier is in operation. In Doherty amplifiers in contrast the peaking amplifier only load modulates the carrier amplifier in the region of the amplitude peaks. In Outphasing amplifiers both amplifiers experience an equal amount of load modulation at back-off.

Figure 9:
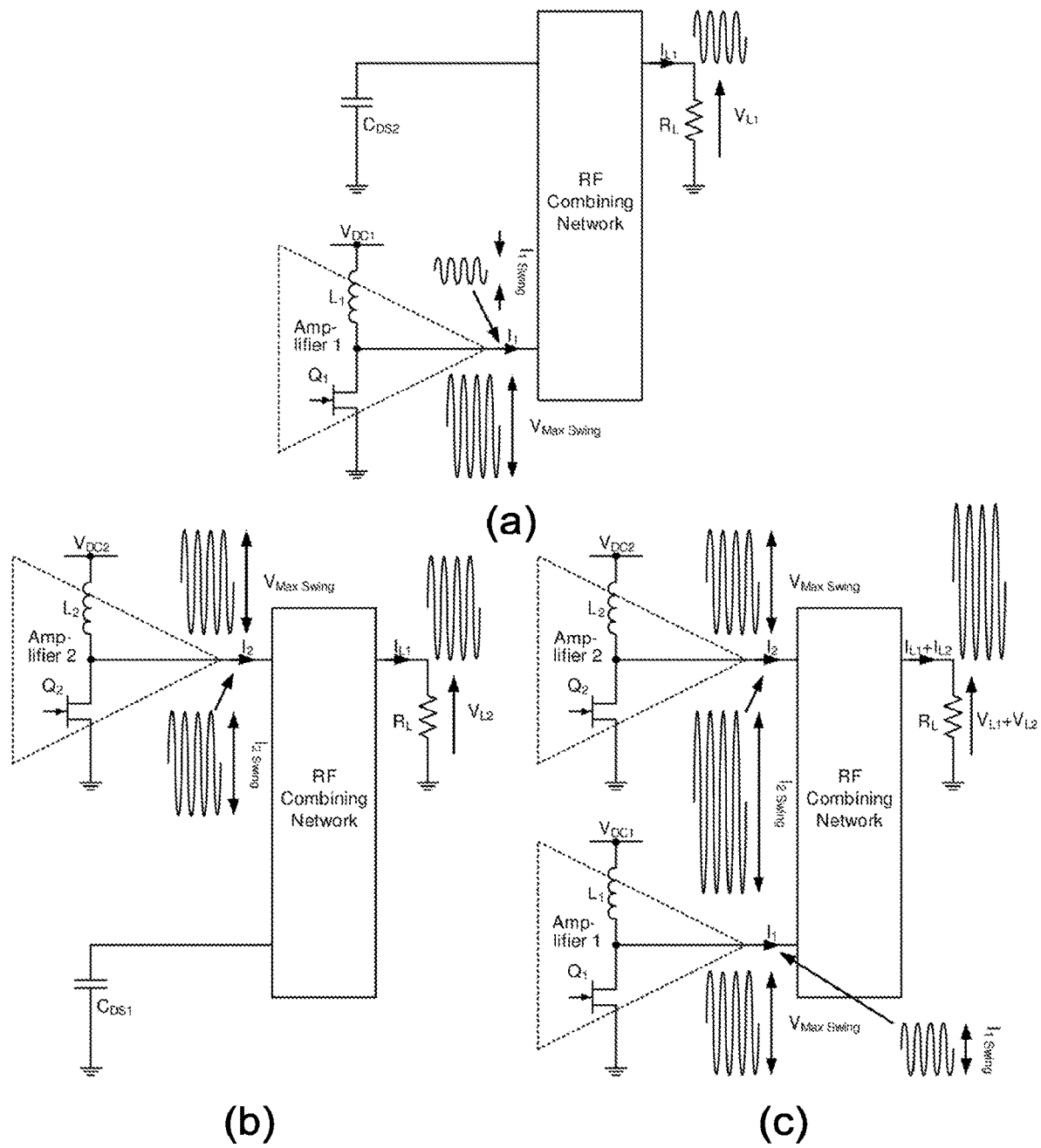
FIG. 9 illustrates the load modulation of a 2-bit DPA in three different states.

The load modulation operation of this DPA is explained in FIG. 9. In this example both amplifiers use the same $V_{DC}$. Consequently, when presented with a different load impedance at their outputs, the output currents will be different. The transistors of each amplifier are enable and disabled by controlling their gate bias. When disabled, a transistor appears as a purely reactive network dominated by its drain-source capacitance ($C_{DS}$). FIG. 9 shows the three active states of the PA. There is of course a fourth inactive state when both amplifiers are off, which results in zero volts across the load $R_L$.

In state 1 (a), Amplifier 1 is enabled and Amplifier 2 is disabled. Amplifier 2 appears as just a capacitor CDS. In this 2-bit system, Amplifier 1 is the least significant bit (LSB) and Amplifier 2 the most significant bit (MSB). Amplifier 1 is operating in saturation, the voltage at its output has a maximum swing of VMax Swing. There is an accompanying current flowing into the RF Combining Network $I_1$ Swing. The RF Combining Network provides the correct transformation so the appropriate impedance is presented to the output of Amplifier 1.

In state 2 (b) where only Amplifier 2 is active, Amplifier 1 appears as capacitor CDS. Its operation is similar to state 1, except that this is the MSB, so produces a larger voltage across RL, hence VL2. In this example Amplifier 1 and Amplifier 2 have the same supply voltage (VDC1 and VDC2). It will be noted that I2 Swing is larger than I1 Swing while VMax Swing remains the same.

In state 3 (c), both Amplifier 1 and Amplifier 2 are enabled. The voltage across RL is equal to the sum of the two voltages from first and second states (VL1+VL2). This results in a larger current flowing into RL than the previous two states. Both Amplifier 1 and Amplifier 2 must provide a greater output current as shown by the larger I1 and I2. This is the load modulation effect. To achieve state 3, the impedance presented to the two amplifiers must be lower than that presented in states 1 and 2. This is effectively moving along the $P_{OUT}$ contour lines shown in the Smith Chart in FIG. 2.

The two or more amplifiers are all driven by the same RF input signal. This will generally have a fixed amplitude, but contain the phase modulation. A power splitter will be used to pass the RF input signal to each amplifier. This can be a splitter with equal ratio splitting or asymmetric with an unequal ratio as required to ensure that all amplifiers operate in saturation. Each amplifier is enabled and disabled by controlling its gate bias. Applying a voltage just above the devices threshold will enable it for amplifying an RF signal applied to its input. Applying a strong negative bias will turn the transistor hard-off.

Embodiments are specifically designed for a high $P_{OUT}$ using discrete devices (as opposed to low power CMOS integration), for applications like TV broadcast transmitters. The transmission line architecture used also lends itself well to high power implementations since losses are low and heat can be easily dissipated.

Figure 10:
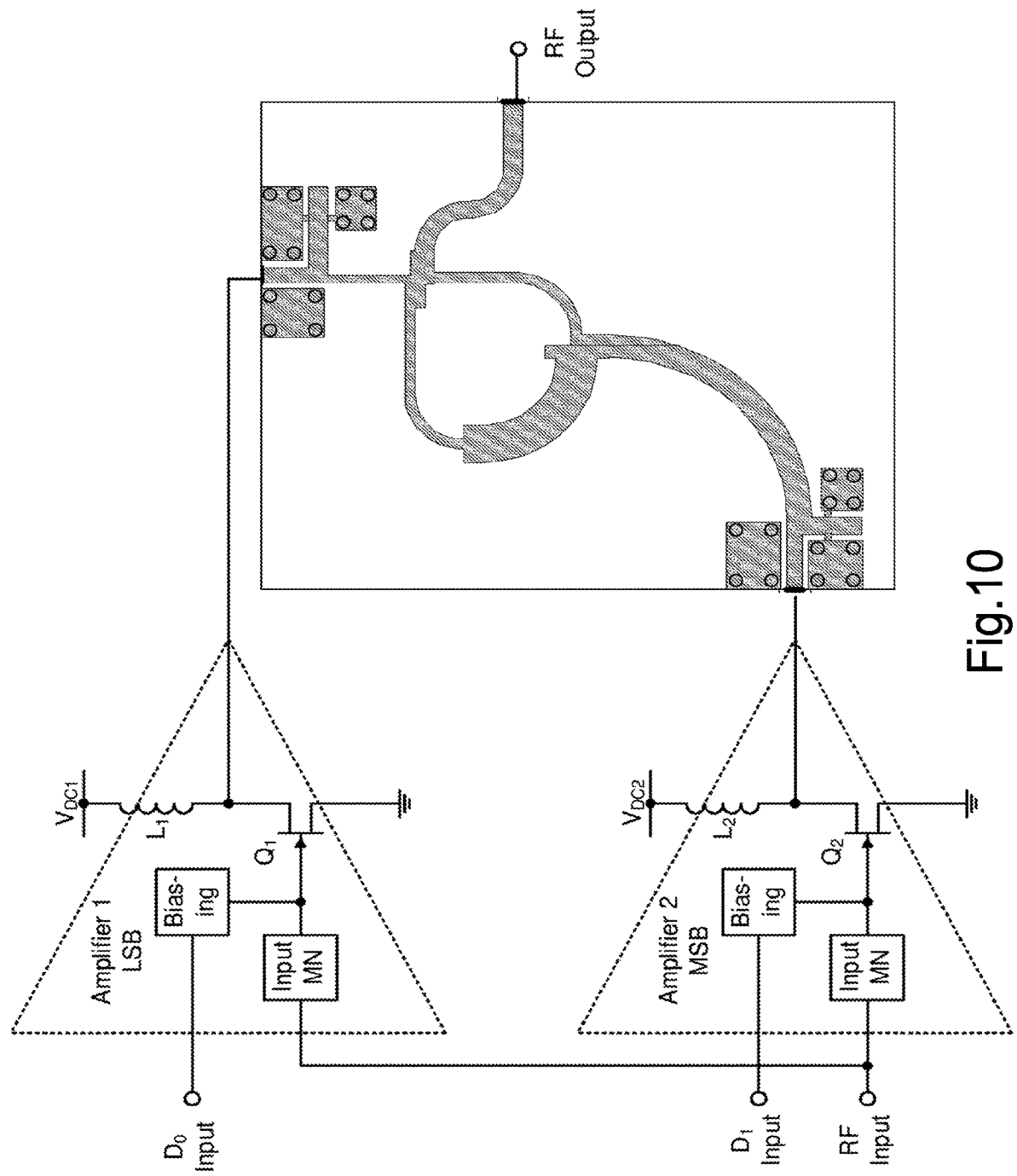
FIG. 10 shows an example of a distributed output network used in simulations.
Figure 11:
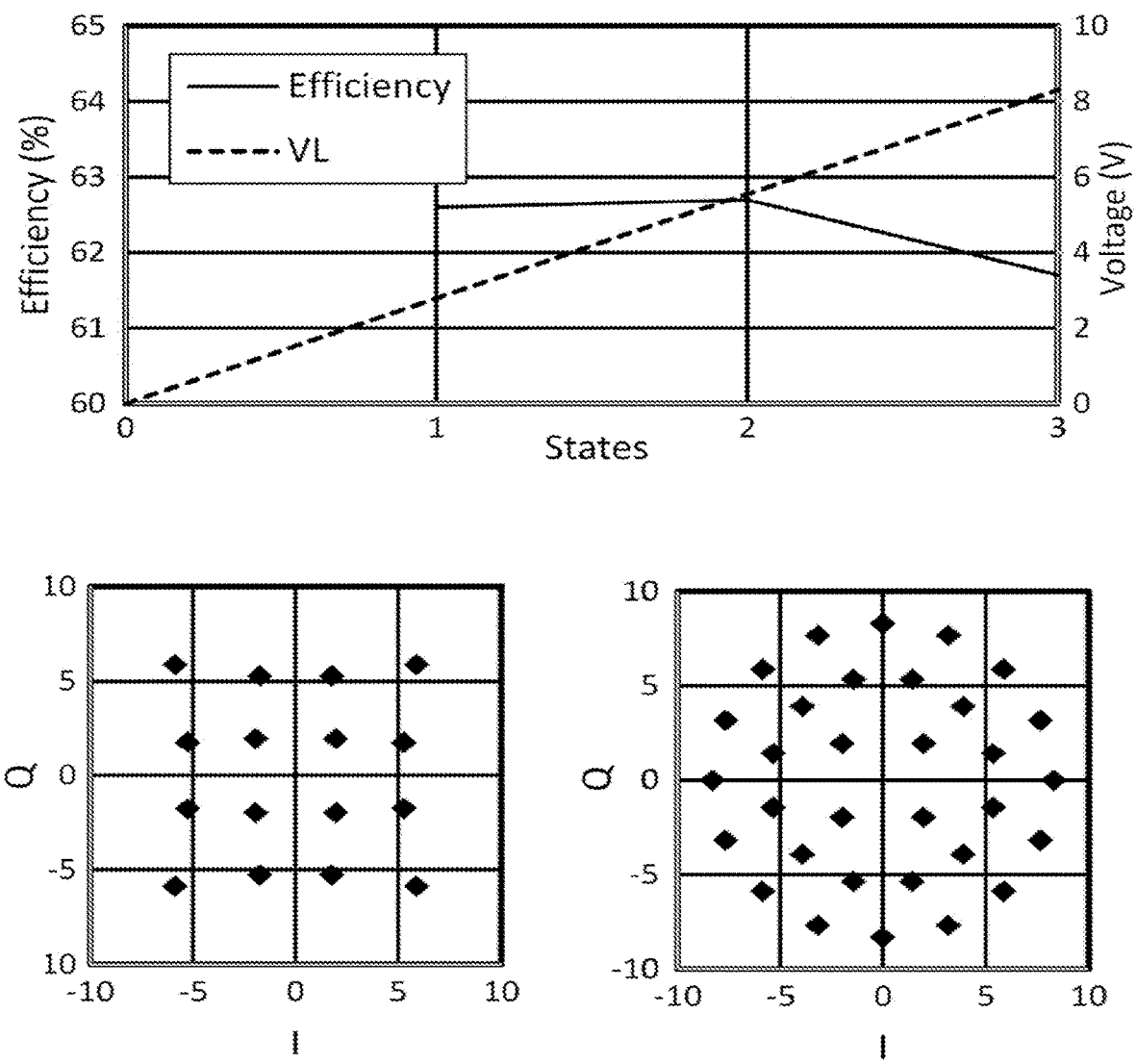
FIG. 11 shows simulated results, clockwise from top: efficiency and output voltage of each state, resulting 32-APSK constellation diagram and resulting 16-QAM constellation diagram.

FIG. 10 shows an example transmission line RF Combining Network which has been developed using numerical optimisation. Simulated results for this network are shown in FIG. 11, where the PA can be seen to maintain efficiency above 60% for all three active states, and exampled 16-QAM and 32-APSK constellation diagrams are given. The dashed line labelled VL in the top part of FIG. 11 is the output voltage provided by the simulated DPA. As can be seen from these constellation diagrams, the two-bit system disclosed herein is capable reliably generating the three output power levels required for transmitting information using either of the 16-QAM and 32-APSK constellations.

While certain arrangements have been described, the arrangements have been presented by way of example only, and are not intended to limit the scope of protection. The inventive concepts described herein may be implemented in a variety of other forms. In addition, various omissions, substitutions and changes to the specific implementations described herein may be made without departing from the scope of protection defined in the following claims.

The invention claimed is:

1. A digital power amplifier comprising:
    a first amplifier configured to receive a first input signal to set active or inactive state of the first amplifier and receive a frequency signal and output, via a first output, a first output signal based on the first input signal and the frequency signal;
    a second amplifier configured to receive a second input signal to set active or inactive state of the second amplifier and receive the frequency signal and output, via a second output, a second output signal based on the second input signal and the frequency signal, wherein the first output is coupled to the second output via a transmission line network, and the transmission line network causes the first amplifier in active state to load modulate the second amplifier in active state; and
    an output terminal configured to output an output signal based on the first output signal and the second output signal received via the transmission line network.

2. The digital power amplifier of claim 1, wherein the first output and the second output are coupled to each other via two signal paths.

3. The digital power amplifier of claim 1, wherein the transmission line network is based on a rat-race combiner, wherein impedances of transmission lines are altered from those of a standard ring combiner to enable load modulation, the transmission lines being included in the transmission line network.

4. The digital power amplifier of claim 1, wherein impedances of transmission lines in the transmission line network are selected so that the impedances presented to the first amplifier in the active state by the combination of the transmission line network and the second amplifier in the active state sets output power of the first amplifier in the active state so that the first amplifier in the active state operates in saturation.

5. The digital power amplifier of claim 1, wherein the transmission line network includes a phase inverter.

6. The digital power amplifier of claim 1, wherein the first amplifier and the second amplifier operate in current saturation at different saturation powers.

7. The digital power amplifier of claim 1, wherein the first amplifier and the second amplifier are configured to receive the first and second input signals for individually setting active or inactive state of the first amplifier and the second amplifier, the first and second input signals being individually applied as gate bias to transistors of the first amplifier and the second amplifier.

8. The digital power amplifier of claim 1, further comprising a signal splitter configured to split input signal, wherein individual outputs of the signal splitter are individually received by the first amplifier and the second amplifier.

9. The digital power amplifier of claim 8, wherein the signal splitter splits the input signal into unequal output signals to operate the first amplifier and the second amplifier in saturation.

10. The digital power amplifier of claim 1, wherein the first amplifier and the second amplifier are discrete devices.

11. The digital power amplifier of claim 1, wherein the first amplifier and the second amplifier and their couples are configured to provide output power levels in saturation optimised for a predetermined signal modulation scheme.

12. A device comprising the digital power amplifier of claim 1, wherein the device is a mobile phone base station or a DVB transmitter.

* * * * *